United States Patent [19]
Lee et al.

[11] Patent Number: 5,491,104
[45] Date of Patent: Feb. 13, 1996

[54] METHOD FOR FABRICATING DRAM CELLS HAVING FIN-TYPE STACKED STORAGE CAPACITORS

[75] Inventors: William W. Y. Lee; Meng-Jaw Cherng; Ing-Ruey Liaw, all of Hsinchu, Taiwan

[73] Assignee: Industrial Technology Research Institute, Hsinchu, Taiwan

[21] Appl. No.: 315,555

[22] Filed: Sep. 30, 1994

[51] Int. Cl.$^6$ .............................. H01L 21/70; H01L 27/00
[52] U.S. Cl. .................. 437/52; 437/60; 437/919
[58] Field of Search ................... 437/47, 52, 60, 437/919; 257/306, 309

[56] References Cited

U.S. PATENT DOCUMENTS

| | | | |
|---|---|---|---|
| 4,914,628 | 4/1990 | Nishimura | 365/149 |
| 5,084,405 | 1/1992 | Fazan et al. | 437/52 |
| 5,126,916 | 6/1992 | Tseng | 437/48 |
| 5,135,883 | 8/1992 | Bae et al. | 437/52 |
| 5,164,337 | 11/1992 | Ogawa et al. | 437/228 |
| 5,164,917 | 11/1992 | Shichijo | 365/149 |
| 5,168,073 | 12/1992 | Gonzalez | 437/47 |
| 5,192,702 | 3/1993 | Tseng | 437/47 |
| 5,223,448 | 6/1993 | Su | 437/52 |
| 5,244,824 | 9/1993 | Sivan | 437/52 |
| 5,281,549 | 1/1994 | Fazan et al. | 437/52 |
| 5,326,714 | 7/1994 | Liu et al. | 437/52 |

*Primary Examiner*—George Fourson
*Assistant Examiner*—H. Jey Tsai
*Attorney, Agent, or Firm*—George O. Saile

[57] ABSTRACT

An improved method for fabricating dynamic random access memory (DRAM) cell having a fin-shaped capacitor with increased capacitance was achieved. The capacitor is fabricated over the bit lines and makes contact to the source/drain area of a field effect transistor (FET). The capacitor with increased capacitance is formed by depositing an N doped polysilicon layer making electrical contact to the source/drain of the FET. A sacrificial oxide layer is deposited and a contact opening formed over the DRAM cell area to the polysilicon layer. A second polysilicon layer is deposited and patterned over the sacrificial oxide layer forming the top fin portion of the capacitor, which makes electrical contact to the first polysilicon layer through the contact opening. The sacrificial oxide layer is then completely removed by wet etching, while the underlying polysilicon layer provides a very important etch stop to protect the substrate structures. The top fin shaped portion of the capacitor is then used very effectively as a mask to anisotropically etch the bottom polysilicon layer, thereby forming a lower fin structure that is aligned to the top fin structure of the capacitor.

23 Claims, 6 Drawing Sheets

METHOD FOR FABRICATING DRAM CELLS HAVING FIN-TYPE STACKED STORAGE CAPACITORS

BACKGROUND OF THE INVENTION

1. Field of the Invention

This invention relates to a random access memory device and, more particularly, is directed to a method of fabricating a dynamic random access memory (DRAM) cell having a fin-type stacked capacitor with increased capacitance.

2. Description of the Prior Art

The integrated circuit density on the semiconductor substrate and the semiconductor chips formed therefrom, has dramatically increased in recent years. This increase in density has resulted from down scaling of the individual devices built in and on the substrate and the increase in packing density. Future requirements for even greater increases in packing density is putting additional demand on the semiconductor technologies and more particularly on the photolithographic techniques.

One circuit type experiencing this demand for increased density is the array of charge storage cells on a dynamic random access memory (DRAM) chip. These individual DRAM storage cells, consisting usually of a field-effect transistor (FET) and a single capacitor are used extensively in the electronics industry for storing data. A single DRAM storage cell stores a bit of data on the capacitor as electrical charge.

As the array of cells increase on the DRAM chip and capacitor decrease in size, it becomes increasingly difficult to maintain sufficient charge on the storage capacitor to maintain an acceptable signal-to-noise level. These volatile storage cells also require more frequent refresh cycles in order to retain their charge.

Since the storage capacitor must occupy an area limited by the cell size, in order to accommodate the array of capacitors on the chip, it is necessary to explore alternative methods for increasing the capacitance without increasing the area that the capacitor occupies on the substrate surface.

Both a trench capacitor, formed in the substrate, and a stacked capacitor, formed on the surface and over the FET, are currently being pursued for DRAM applications. Several approaches to making DRAM circuits using trench capacitors have been described in U.S. Pat. No. 4,914,628 by T. Nishimura, in U.S. Pat. No. 5,164,917 by H. Shichijo and by R. D. Sivan in U.S. Pat. No. 5,244,824. However, the stacked capacitors has received considerable interest in recent years because of the variety of ways that its shape can be controlled to increase the capacitance without increasing the area it occupies on the substrate. This makes the stacked capacitor very desirable for DRAM application.

Numerous three-dimensional stacked capacitor structures have been reported. For example, H—H. Tseng, U.S. Pat. No. 5,192,702 teaches methods of fabricating vertical sidewall capacitors and P. Fazan et al, U.S. Pat. No. 5,084,405 teaches methods of forming double ring stacked capacitors structures using sidewall spacer techniques.

However, one type of three-dimensional stacked capacitor structure receiving considerable interest is the capacitor having a fin shaped electrodes extending up-ward and over the cell area. For example, H. Ogawa et al describes a method in U.S. Pat. No. 5,164,337, in which a multilayer of dissimilar insulators or a multilayer of dissimilar doped polysilicon layers are patterned over the insulated substrate to form a fin-type capacitor.

Most of these stacked fin-type capacitor structures require additional processing steps and the underlying device structures must also be protected from process damage when the stacked storage capacitor is being fabricated on the substrate.

Although there has been considerable work done to increase the capacitance area on these very small stacked fin shaped capacitors, it is still desirable to further improve these capacitors while retaining as simple a process as possible to maintain high chip yields, low cost and good reliability. This is especially true as the DRAM increase to 64 Mbits on a chip.

SUMMARY OF THE INVENTION

Accordingly, it is a principal object of this invention to provide a stacked storage capacitor having a fin shaped electrode that increases the capacitance.

It is another object of the present invention to provide an improved method for fabricating the stacked storage capacitors using an etch stop layer so that the underlying devices are protected from damage during the etch processing of the capacitor structure.

It is still another object of the invention to increase the capacitance while maintaining a low cost manufacturing process.

This invention addresses these objects by teaching a method for forming dynamic random access memory (DRAM) cells having fin-type stacked capacitors. The bottom electrode is partly comprised of a thin polysilicon layer that serves the important functions of being an etch stop layer during the fabrication process.

The method for forming the DRAM cell begins by forming a relatively thick field oxide (FOX) on the surface of a semiconductor substrate while leaving device areas for fabricating a field effect transistor. A gate dielectric layer is formed on the surface of the device areas. A first layer polysilicon layer is deposited over the field oxide areas and the device areas, and then a first insulating layer is deposited thereon. The two layers are patterned using convention photolithography and etching to form gate electrodes on the device areas and electrically conducting word lines elsewhere on the field oxide. Source/drain structures are formed in the device areas adjacent to the gate electrodes by doping with impurities. Sidewall spacers are then formed on the gate electrodes and the word lines by depositing a second insulating layer and anisotropically etching back to the source/drain surface and thereby forming a field effect transistor (FET). A third insulating layer is deposited over the source/drain regions and elsewhere on the substrate. Contact openings are then formed in the third insulating layer to one of the two source/drain regions of each FET.

A second polysilicon layer and a metal silicide layer, contacting the source/drain regions through the contact openings in the third insulating layer, are then deposited on the substrate and patterned by conventional photolithography and anisotropic etching to form the electrically conducting bit lines of the DRAM circuit.

A fourth insulating layer, also referred to as the substrate insulating layer, is now deposited on the substrate to electrically insulate the bit lines and underlying device structures from the stacked storage capacitor structures built thereon. Contact openings, as the capacitor node contacts, are formed in the fourth and third insulating layer to the second of the source/drain regions. The third and fourth layers are also referred to, in this invention, as a substrate insulating layer. A third polysilicon layer, also referred to as the first bottom electrode polysilicon layer, is deposited. This layer is important to the invention because it serves the dual purpose as an etch stop layer during subsequent processing and later as one of the fin structures on the completed capacitor. A fifth insulating layer, also referred to as a sacrificial oxide layer is deposited over the third polysilicon layer. Using conventional photolithography and etching, contact openings are etched in the fifth insulating or sacrificial layer providing electrical contact to the third polysilicon or first bottom electrode polysilicon layer over the source/drain regions. A fourth polysilicon layer, also referred to as the second bottom electrode polysilicon layer, is deposited and patterned leaving portions over the DRAM cell areas and exposing the fourth insulating layer elsewhere on the substrate. The fourth insulating layer is now completely removed by an isotropic wet etch, while the third polysilicon layer serves the important function as an etch stop to protect the underlying insulating layers from being etched. Now, the patterned fourth polysilicon layer is used as a mask, and anisotropic etching is used to pattern the third polysilicon layer, thereby forming the array of bottom capacitor electrodes having fin-type shapes and electrically isolated from each other.

The capacitors for the DRAM cells are now completed by forming a thin capacitor dielectric layer on the surface of the fin shaped bottom electrodes and then depositing a conformal fifth polysilicon layer to form the top electrode of the capacitors.

BRIEF DESCRIPTION OF THE DRAWINGS

The objects and advantages of this invention are best understood by the following embodiments with reference to the attached drawings which are now briefly described.

DESCRIPTION OF THE PREFERRED EMBODIMENTS

Now in keeping with the objects of this invention, the method for forming the dynamic random access memory cells having improved stacked storage capacitors with increased capacitance is covered in detail. The sequence of fabrication steps for the embodiment are depicted in FIGS. 1 to 11.

It should also be well understood by one skilled in the art that by including additional process steps, in addition to those described in this embodiment, other types of devices can also be included on the DRAM chip, For example, P channel MOSFETs can be formed by providing N-Wells in the P substrate and Complementary Metal-Oxide Semiconductor (CMOS) circuits can also be formed therefrom.

Figure 1:
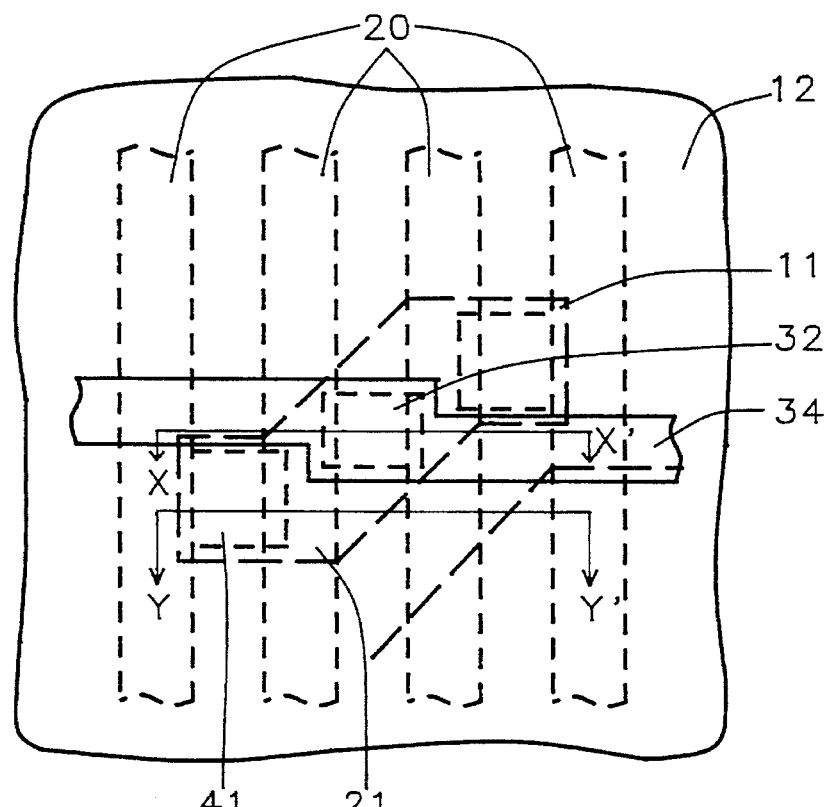
FIG. 1 is a schematic elevational view of a portion of the DRAM chip depicting a DRAM cell having a common bit line contact and two capacitor node contacts each on one side of a FET gate electrode.

Referring now to FIG. 1, shown is a schematic elevational view of a partially completed DRAM chip showing a portion of the storage cell area. Shown is the field oxide area 12 surrounding and isolating the device area 11. A patterned first polysilicon layer 20 is used to form the FET gate electrode 21 over the device area 11 and the interconnecting word line 20 elsewhere on the substrate. A patterned second polysilicon layer 34 is used to form the bit line interconnections making contact to the bit line contact 32 which is one of the two source/drain areas adjacent to the gate electrode 21 of the FET. The second of the two source/drain contacts is then used as the capacitor node contact 41 for the storage capacitor. The details of the embodiment of this invention are now described with reference to the cross section X—X' through the bit contact area 32 and the cross section Y—Y' through the capacitor node contact area 41 and the gate electrode 21 as indicated in FIG. 1. To simplify the understanding of the invention, not all of the process levels are shown in FIG. 1.

Figure 2:
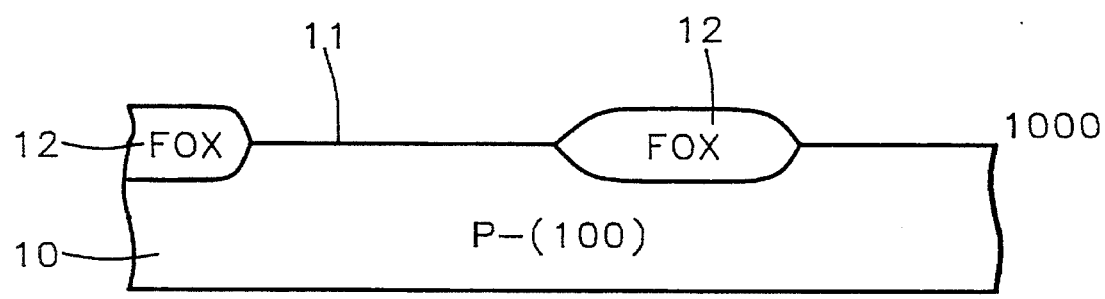
FIGS. 2 through 12 are schematic cross-sectional representation of the embodiment of the invention for fabricating the DRAM cell having the fin-type stacked capacitor of this invention. The cross sectional views are shown for cross section X—X' through the bit line contact are and the cross section Y—Y' through the capacitor node contact and FET, as indicated in FIG. 1.

Referring now to FIG. 2, the cross-sectional view Y—Y,' in FIG. 1, of a substrate 10 is shown with only the Field OXide (FOX) 12 formed on the substrate surface. The preferred substrate 10 is composed of a P-type single crystal silicon having a <100> crystallographic orientation. A relatively thick Field OXide (FOX) 12 is formed around the active device regions to isolate the individual device regions. This field oxide, as shown in FIG. 2, is formed by depositing a thin silicon oxide (pad oxide) and a thicker silicon nitride layer as an oxidation barrier layer are deposited on the silicon substrate 10. These layers are not shown in FIG. 2. Conventional photolithographic techniques and etching are then used to pattern the silicon nitride layer, removing the silicon nitride in areas where a field oxide is desired while retaining the silicon nitride in areas where active device are to be fabricated. The silicon substrate is then oxidized to form the Field OXide (FOX) 12. The preferred thickness is between about 4000 to 5000 Angstroms, and more specifically having a thickness of about 4500 Angstroms.

Figure 3:
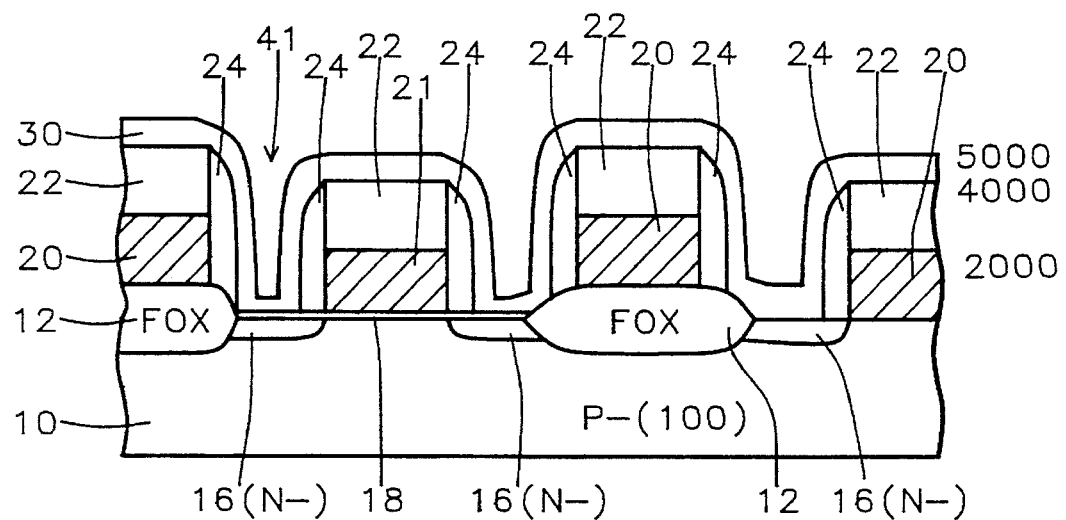

Referring now to FIG. 3, the semiconductor device is then formed in the active device region after removing the silicon nitride barrier layer and pad oxide in a wet etch. The most commonly used device for dynamic random access memory (DRAM) is the Field-Effect Transistor (FET). This device is formed by first thermally oxidizing the active device region to form a thin gate oxide 18. The preferred thickness being from between about 90 to 120 Angstroms. A first polysilicon layer 20 is blanket deposited by low pressure chemical deposition (LPCVD) methods. The preferred thickness is between about 1000 to 2000 Angstroms, and more specifically having a thickness of about 2000 Angstroms. The first polysilicon layer 20 is doped by ion implanted with phosphorus ($p^{31}$) or arsenic ($As^{75}$) ions or alternatively by in situ doping during the polysilicon deposition. The preferred concentration being between about 1 E 20 to 1 E 22 atoms/$cm^3$. A first insulating layer 22 is then deposited on layer 20 and conventional photolithographic techniques and etching are used to pattern the insulating layer 22 and polysilicon layer 20. This forms the gate electrode 21 for the FET in the active device regions and electrically conducting patterned polysilicon lines 20 elsewhere on the substrate with the insulating layer 22 thereon. These conducting patterns form the word lines that electrically connect the FET gate electrode to the appropriate peripheral circuits on the DRAM chip. Lightly doped source/drain areas 16 are formed next, usually by implanting an N-type dopant species such as arsenic or phosphorus. For example, a typical implant might consist of phosphorus p31 at a dose of between about 1E 12 to 1E 14 atoms/cm$^2$ and more specifically an implant dose of 1.0 E 13 ions/cm$^2$. The preferred ion implant energy is between about 30 to 80 KeV.

After forming the lightly doped source/drain areas adjacent to the gate electrode 21, sidewall spacers 24 are formed on the gate electrode sidewalls, also shown in FIG. 3. These sidewall spacers 24 are formed by depositing a second insulating layer 24, and then anisotropically etching back the oxide layer to the silicon surface. For example, the insulating layer 24 can be composed of silicon oxide formed by low pressure chemical vapor deposition (LPCVD) using a reactant gas containing tetraethoxysilane (TEOS) and at a temperature in the range of between about 650° to 900° C. The etch back can be performed in a plasma etcher at low pressure, such as by reactive ion etching (RIE). In this invention the source/drain ohmic contacts are provided at a later processing step by out diffusion from a doped polysilicon layers. A third insulating layer 30, also shown in FIG. 3 is now deposited on the substrate surface to electrically insulate the source/drain contacts 16.

Figure 4:
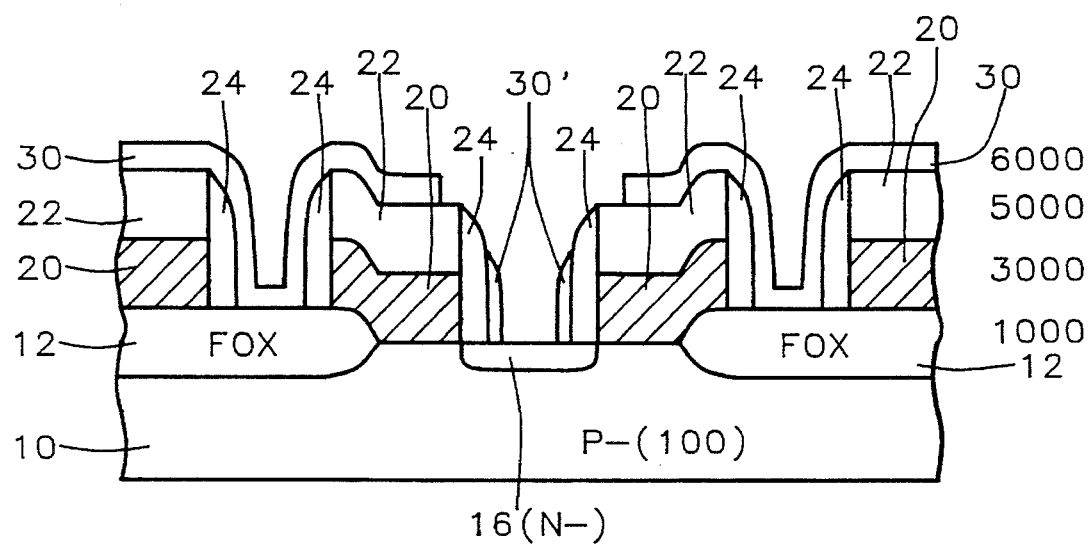

Referring now to FIG. 4 and the cross section through X—X' of FIG. 1, the bit line contact opening 32 is formed in the third insulating layer 30 to one of the two source/drain areas of the FET. Conventional photolithographic techniques and etching are used to etch the contact opening in layer 30 down to the source/drain contact 16. For example, an etch in a low pressure plasma etcher, such as in a reactive ion etcher (RIE) can be used. The preferred reactive etch gas is a mixture such as carbon tetrafluoride (CF$_4$) and trifluoromethane (CHF$_3$) in an argon (Ar) carrier gas, and the etching parameters are chosen so as to provide some bias etching (semi-anisotropic).

This then removes most of layer 30 from the sidewall of the recess formed by the patterned layers 20 and 22, leaving a small portion of layer 30 as indicate by 30' in FIG. 4. The contact opening is also made larger (self-aligning) than the recess. The bias etching and self-aligned contact then insures that the contact is sufficiently large to provide low contact resistance.

Figure 5:
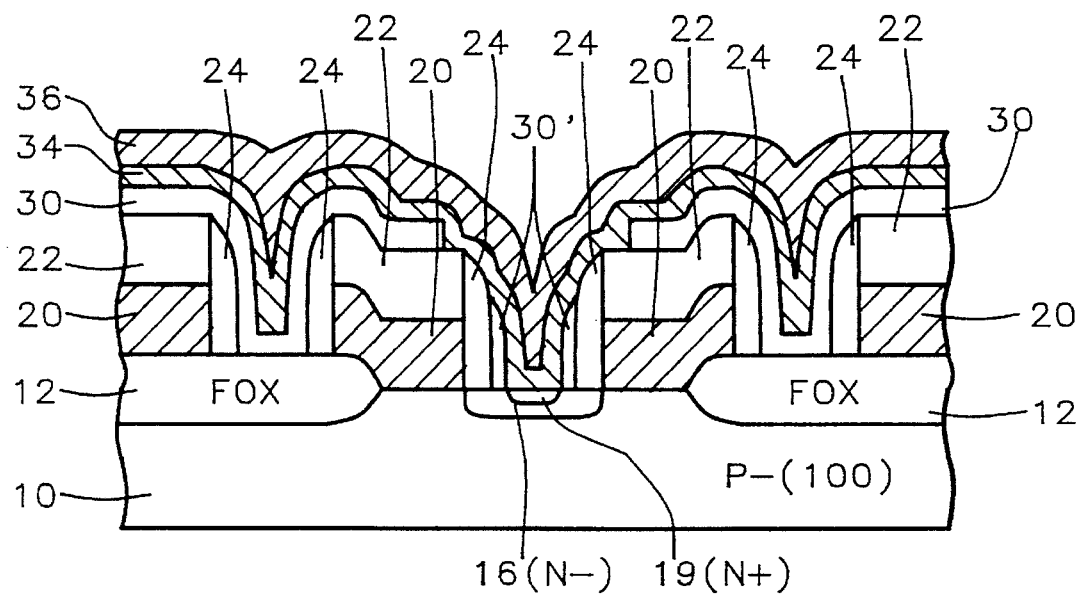

Referring now to FIG. 5, and still representing the cross section through the substrate as indicated by X—X' in FIG. 1, a second polysilicon layer 34 is deposited, for example, by low pressure chemical vapor deposition (LPCVD). The layer 34 is in situ doped N-type such as with phosphorus atoms having a concentration of between about 1 E 21 to 1 E 22 atoms/cm$^3$. The out diffusion of the phosphorus into the silicon substrate provides the ohmic contact 19 for the bit line contact. The preferred thickness of layer 34 is between about 500 to 1500 Angstroms. To further improve the electrical conductivity and thereby the performance of the circuit, a metal silicide is also deposited on the polysilicon layer 34. For example, a tungsten silicide can be formed by LPCVD using a gas mixture containing tungsten hexafluoride (WF$_6$). The preferred thickness of the silicide layer 36 is between about 500 to 1500 Angstroms.

Layer 34 and layer 36 are then patterned to form the interconnecting bit line metallurgy as shown in FIG. 5. The layer is not shown patterned in FIG. 5, because the cross section X—X' lies within the patterned portions of layer 34, as indicated in FIG. 1.

Figure 6:
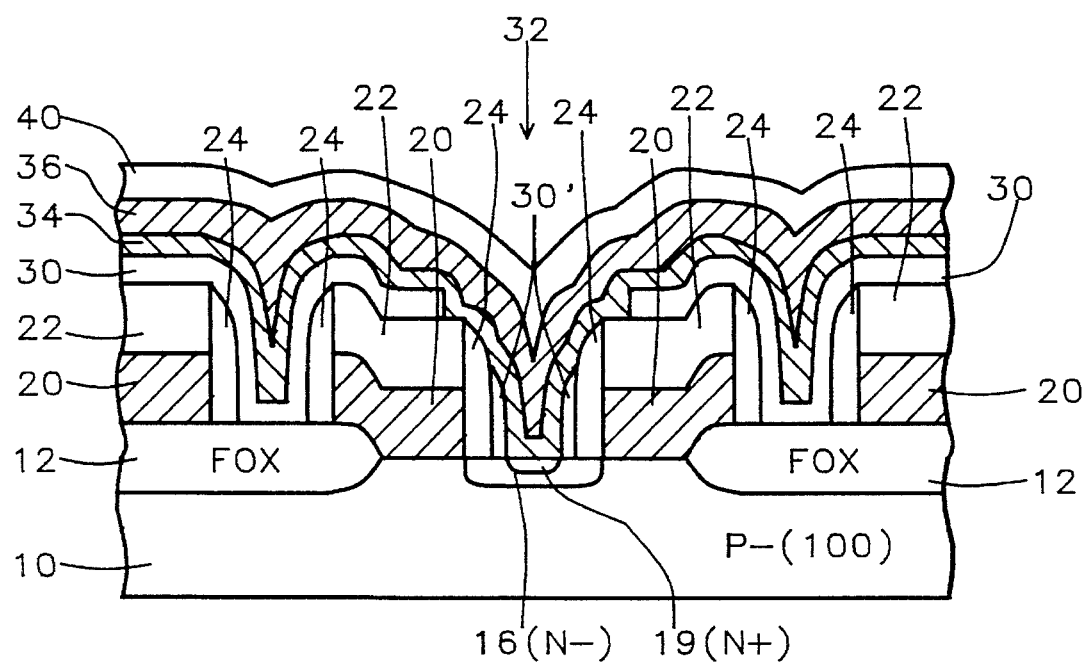

Now as shown in FIG. 6 and still referring to section X—X' in FIG. 1, a fourth insulating layer 40 is deposited. The primary purpose of this layer is to provide the electrical insulation over the bit line metallurgy upon which the stacked storage capacitors is now fabricated. The preferred deposition is a low pressure chemical vapor deposition (LPCVD) of silicon oxide, deposited for example, using TEOS as the process gas. The preferred thickness of layer 40 is between about 500 to 1000 Angstroms.

Figure 7:
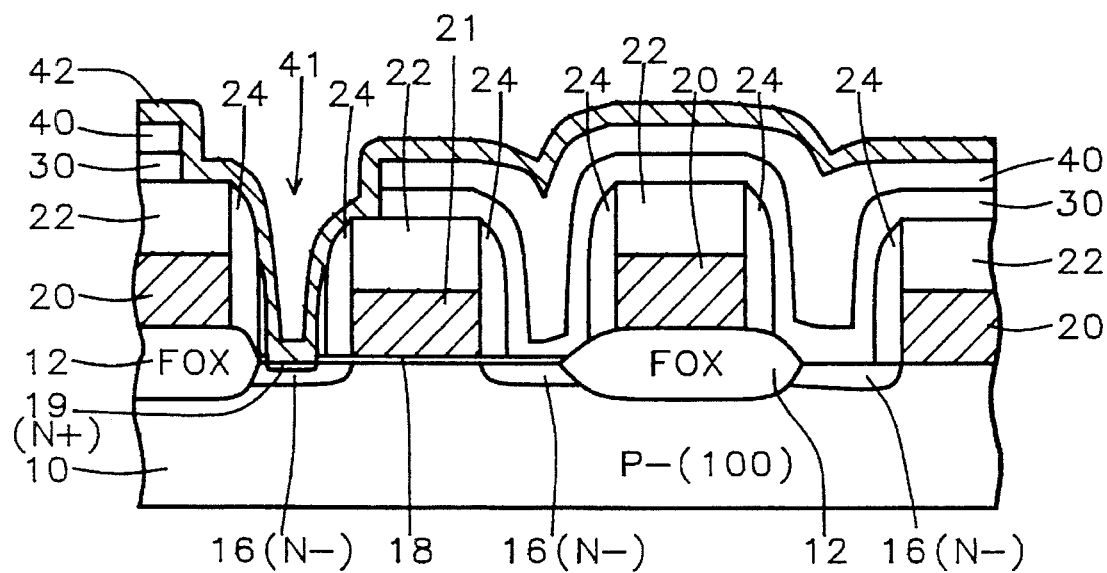

Referring now to FIG. 7, the embodiment of the invention relating more specifically to the formation of the fin shaped storage capacitor having increased capacitance is now covered in detail. FIG. 7 is a cross section of the substrate structure as shown by Y—Y' in FIG. 1 which is a cross section through the source/drain area 16 of the FET and through the gate electrode 21 of the FET. Conventional photolithographic techniques and etching are now used to form the contact opening 41, in insulating layers 30 and 40, to the second of the two source/drain areas of the FET. The combined layers 30 and 40 are also referred to as the substrate insulating layer. The contacts are etched open using plasma etching, such as in a reactive ion etcher (RIE), and the preferred reactive etch gas mixture is again composed of CF$_4$/CHF$_3$ and Ar.

A third polysilicon layer 42, also referred to as the first bottom electrode polysilicon layer 42 is now conformally blanket deposited on the substrate. The preferred deposition is by low pressure chemical vapor deposition (LPCVD). The polysilicon layer makes electrical contact to the source/drain area of the FET, and thereby forming the capacitor node contact. The preferred thickness is between about 500 to 2000 Angstroms, and more particularly having a thickness of about 500 angstroms.

The polysilicon layer 42 is in situ doped N-type, such as with phosphorus atoms having a concentration of between about 1 E 21 to 1 E 22 atoms/cm$^3$. The out diffusion of the phosphorus from layer 42 into the silicon substrate provides the ohmic contact 18 for the capacitor node contact.

Figure 8:
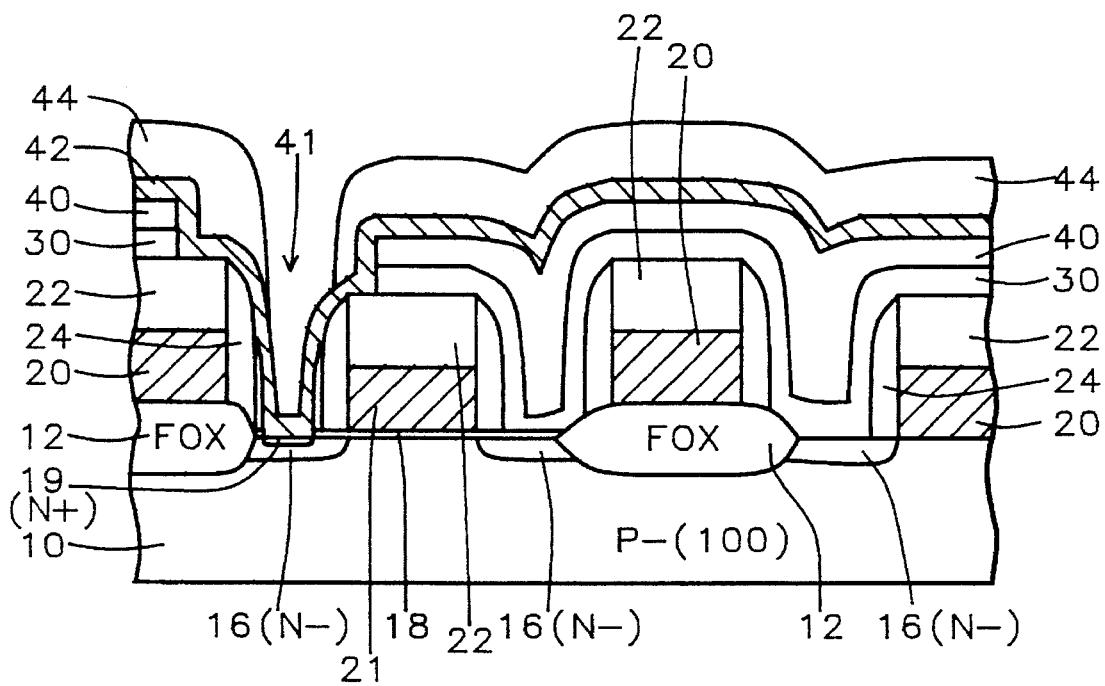

Referring now to FIG. 8, a fifth insulating layer 44, also referred to as the sacrificial oxide layer 44 is deposited. The preferred insulating layer is a silicon oxide, for example, deposited by LPCSD and using a process gas mixture containing tetraethoxysilane (TEOS). The preferred thickness is between about 1000 to 3000 Angstroms, but more specifically having a thickness of about 2000 Angstroms.

Contact openings 41 are now formed in the fifth insulating layer 44 over the source/drain area and making contact to the third polysilicon layer 42, as shown in FIG. 8. The preferred etching is an anisotropic plasma etch having a high etch rate selectivity to polysilicon. For example, the etching can be performed in a reactive ion etcher using a gas mixture containing carbon tetrafluoride and hydrogen or alternatively, a gas mixture containing trifluoromethane (CHF$_3$). The etch rate ratio being greater than about 10 to 1.

The layer 42 providing the important function of an etch stop layer for the plasma etch and thereby prevents erosion of the underlying insulating layers, such as layer 22 and the sidewall spacers 24.

Figure 9:
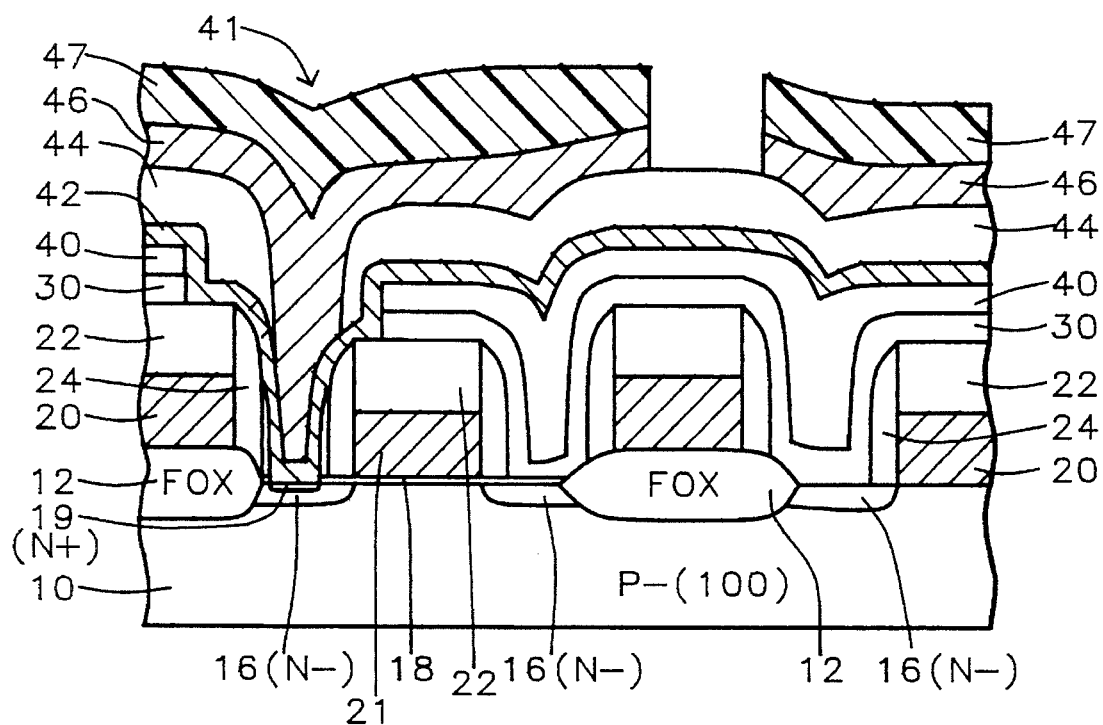

Referring now to FIG. 9, a fourth polysilicon layer 46, also referred to as the second bottom electrode polysilicon layer 46 is deposited over the sacrificial layer 44 and in the contact opening 41 to complete the depositions for the bottom electrode structure of the stacked capacitor. As seen in FIG. 9, layer 46 makes contact to layer 42 in the contact opening 41. The polysilicon layer 46 is preferably deposited by LPCVD and is in situ phosphorus doped having a concentration of between about 1 E 21 to 1 E 22 atoms/cm$^3$. The preferred thickness of layer 46 is between about 2000 to 5000 Angstroms and more specifically having a thickness of about 2000 Angstroms.

A photoresist mask 47 is formed by photolithography and then anisotropic plasma etching is used to pattern the fourth polysilicon layer 46, as is also shown in FIG. 9. The patterned portions forming the fin shaped part of the bottom electrodes of the capacitors over the DRAM cell areas, while exposing the sacrificial oxide layer 44 elsewhere on the substrate.

Figure 10:
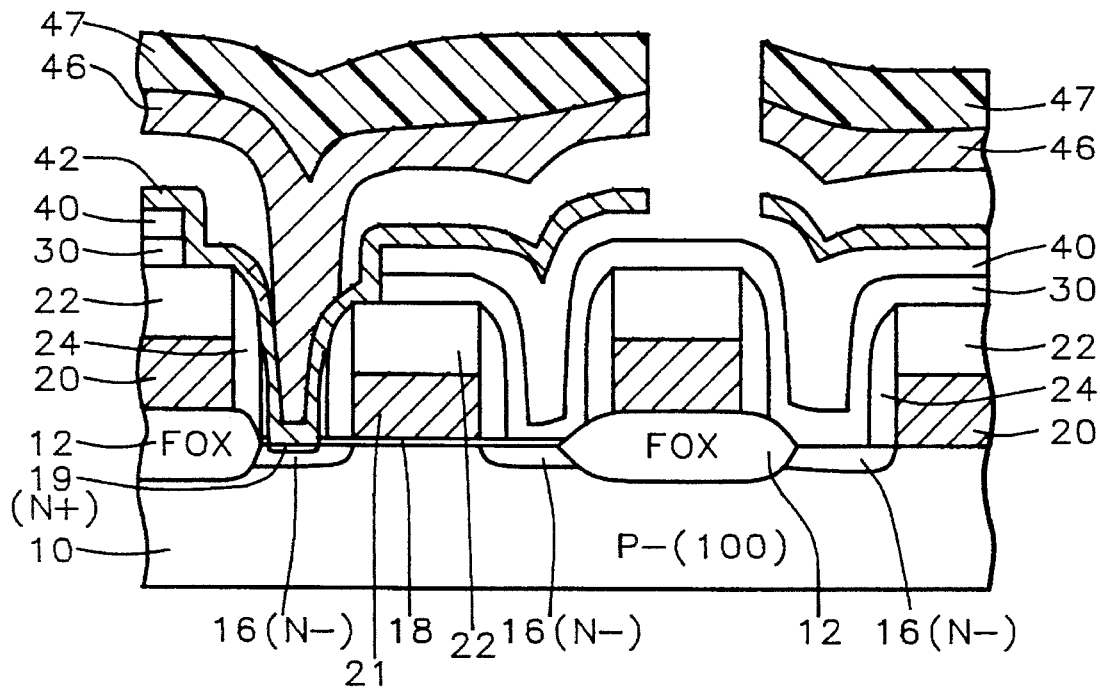

The fourth insulating layer or sacrificial oxide layer 44 is now isotropically wet etched to remove completely the layer 44 from the substrate surface, as shown in FIG. 10. The third polysilicon layer 42 or first bottom electrode polysilicon layer 42 serves the very important function, as an etch stop layer, preventing the isotropic wet etch from eroding the underlying insulating layers, such as layers 40, 30, 22 and 24, that protect the FET devices and bit lines on the substrate, as is seen in FIG. 10. The preferred wet etch is performed in a buffered oxide etch (BOE) composed of a solution of ammonium fluoride ($NH_4F$) and hydrofluoric acid (HF) in the volume ratio of between about 5:1 to 20:1.

The upper patterned fourth polysilicon layer 46 having the photoresist layer 47 thereon is now used, in this invention, as an etch mask to pattern and thereby form a patterned third polysilicon layer 42 which is self-aligned to the upper patterned layer 46. The preferred etch is an anisotropic etch, such as in a reactive ion etcher (RIE) at a low processing Pressure and in a gas mixture containing, for example, chlorine ion species. The preferred etch is for example, performed at a pressure of between about 200 to 400 mTorr in a reactive gas mixture of chlorine ($Cl_2$) and argon (Ar).

Figure 11:
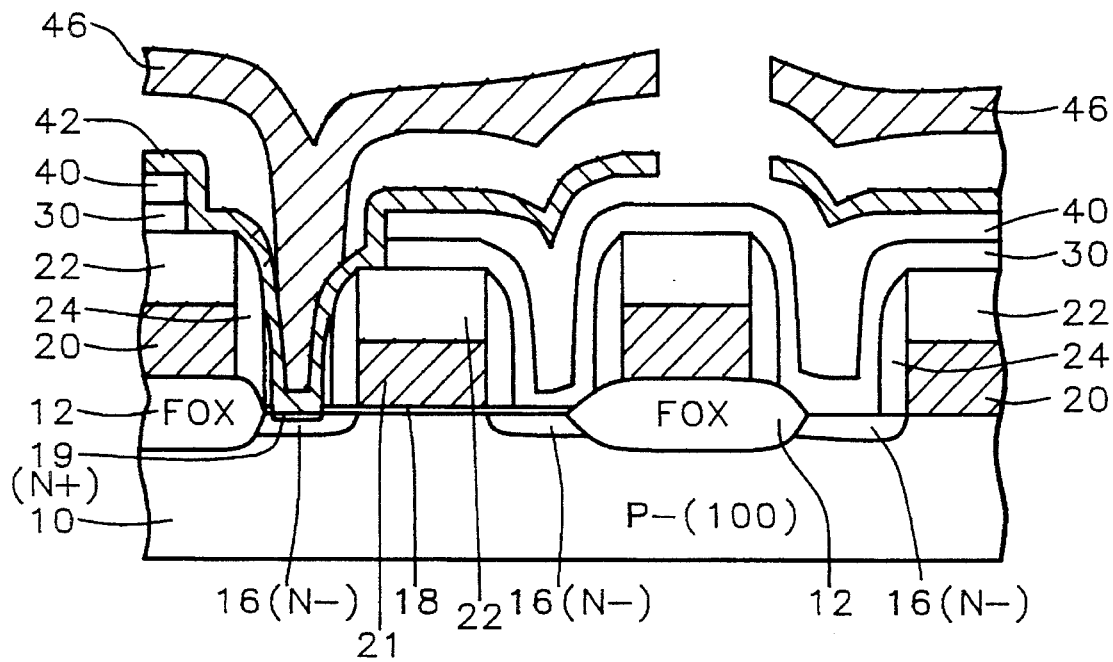

Now referring to FIG. 11, the photoresist layer 47 is stripped by conventional means leaving a completed bottom capacitor electrode structure composed of third and fourth polysilicon layer 42 and 46. The bottom electrode is substantially increased is surface area having a fin shaped portion formed from layer 46 and a half fin portion formed from layer 42.

Figure 12:
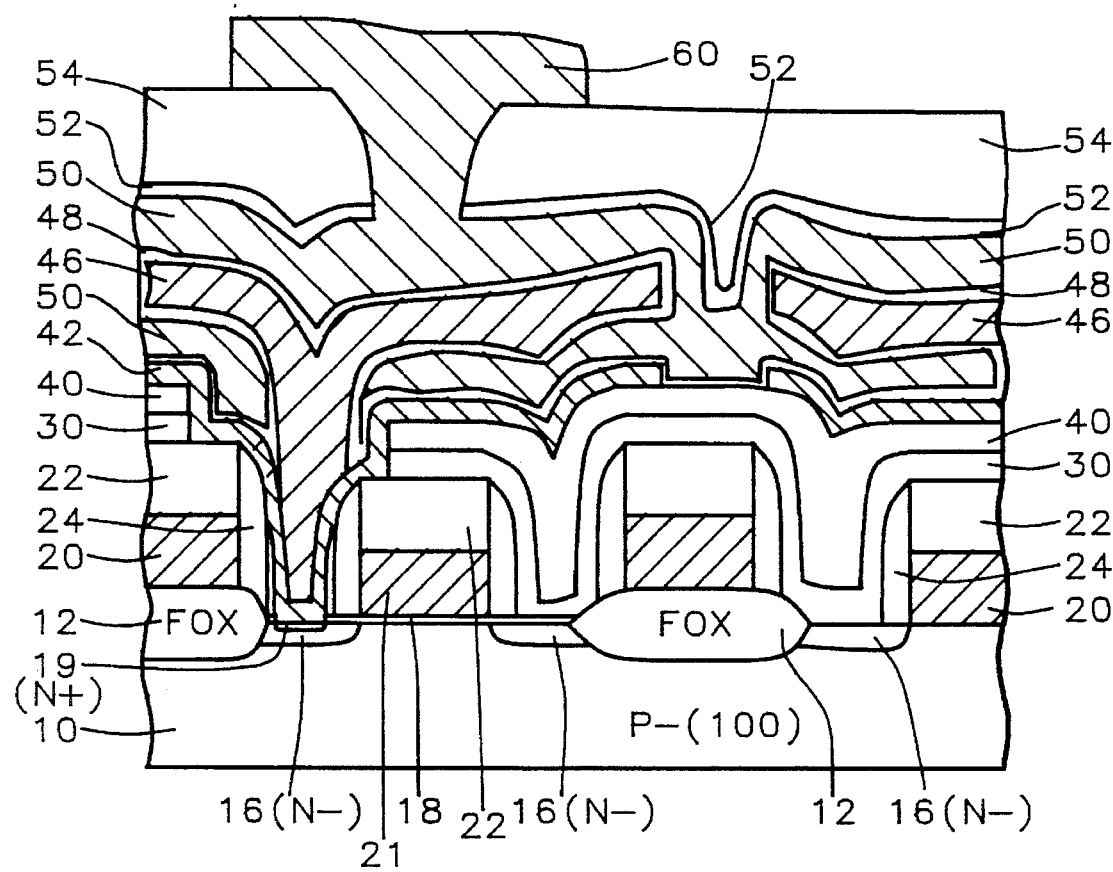

Referring now to FIG. 12, a thin capacitor dielectric layer 48, having a high dielectric constant, is formed on the surface of the bottom electrode comprised of layers 42 and 46. The layer 48 is typically composed of layers of silicon oxide and silicon nitride (ON) or a triple layer of silicon oxide-silicon nitride- silicon oxide (ONO). The first silicon oxide layer can be formed by thermal oxidation of the polysilicon surface in dry oxygen. The silicon nitride is formed by LPCVD, for example, in a gas mixture of $SiCl_2H_2$ and ammonia ($NH_3$). The top silicon oxide layer is then formed by exposing the silicon nitride surface to dry oxygen at elevated temperatures and thereby, completing the ONO triple layer. The total thickness of the ON or ONO layer 48 is preferably about 50 to 60 Angstroms.

Prior to forming the capacitor dielectric layer 48, the surface of the fin shaped bottom electrode can be roughened to further increase the surface area and thereby increase the capacitance. For example, the N doped polysilicon surface can be subjected to a wet etch, such as in phosphoric acid, at a temperature of about 140° C. to partially etch and roughen the surface.

As also shown in FIG. 12, a fifth polysilicon layer 50, also referred to as the top electrode polysilicon layer 50, is now deposited on, around and in the recesses of the bottom electrode and over the capacitor dielectric layer 48 forming the top electrode of the storage capacitor and completing the fin shaped storage capacitors. The preferred thickness of polysilicon 50 is from between about 1000 to 2000 Angstroms, and is doped with N-type impurity, such as arsenic and phosphorus species. The preferred concentration being in the range between about 1 E 20 to 1 E 21 atoms/$cm^3$. Low pressure chemical vapor deposition and in-situ doping is used to deposit the conformal polysilicon layer 50.

The array of dynamic random access memory cells are now electrically insulated by depositing a LPCVD silicon oxide layer 52, typically formed by LPCVD using a reactive gas, for example, containing TEOS. The preferred thickness is between about 1000 to 2000 Angstroms. And then a low flow temperature silicon oxide layer 54, composed of, for example, borophosphosilicate glass (BPSG) is deposited, and annealed at elevated temperature of about 850° to 950° C. to passivate and make more planar the substrate surface.

High levels of interconnecting metallurgy are then used to complete the wiring on the chip after forming contact openings in the insulating layers 54 and 52. For example, as shown in FIG. 12, a patterned aluminium or aluminium copper alloy layer 60 can be used. One such use is to form contacts to the top electrode 50 of the capacitor to provide an electrical ground and complete that portion of the DRAM circuit.

While the invention has been particularly shown and described with reference to the preferred embodiments thereof, it will be understood by those skilled in the art that various changes in form and details may be made without departing from the spirit and scope of the invention.

What is claimed is:

1. A method for fabricating dynamic random access memory cells on a semiconductor substrate having field effect transistors and storage capacitors, comprising the steps of:

selectively forming a field oxide on portions of a silicon substrate while providing device areas for fabricating field effect transistors;

forming a gate dielectric layer on said substrate in said device areas;

depositing a first polysilicon layer on said field oxide areas and said device areas;

depositing a first insulating layer on said first polysilicon layer;

masking and etching said first insulating layer and said first polysilicon layer, thereby forming gate electrodes on said device areas and electrically conducting word lines elsewhere on said substrate;

forming source/drain regions within said device areas adjacent to said gate electrodes by implantation;

depositing a second insulating layer on said substrate; and anisotropically etching back said second insulating layer to said source/drain regions and thereby forming sidewall spacers on sidewalls of said gate electrodes and said word lines;

depositing a third insulating layer on said substrate over said source/drain regions and elsewhere on said substrate; and selectively forming contact openings in said third insulating layer to one of the two said source/drain regions of each field effect transistor;

depositing a second polysilicon layer on said substrate, making electrical contact to said source/drain regions in said contact openings; and depositing a metal silicide layer on said second polysilicon layer;

patterning by masking and etching said metal silicide layer and said second polysilicon layer and thereby forming electrically conducting bit lines contacting said source/drains of said field effect transistors;

depositing a fourth insulating layer on said substrate and forming said storage capacitor by, forming a contact opening in said fourth and third insulating layer exposing a second source/drain region of each of said field effect transistors, conformally depositing a third polysilicon layer on said substrate without filing said contact openings to said source/drain regions, and thereby making electrical contact by out diffusing dopants from said third polysilicon layer to said source/drain regions in said contact openings in said third and fourth insulating layers, depositing a fifth insulating layer and thereby providing a sacrificial silicon oxide layer for forming said storage capacitors, masking and etching contact openings in said fifth insulating layer exposing said third polysilicon layer only and directly over said second source/drain regions of said field effect transistors, depositing a fourth polysilicon layer over said fifth insulating layer and making electrical contact to said third polysilicon layer through said contact openings in said fifth insulating layer, and wherein said fourth polysilicon layer fills said contact openings in said fifth insulating layer, patterning said fourth polysilicon layer over said fifth insulating layer and thereby defining bottom electrode over each of said dynamic random access memory cell areas, etching isotropically and removing said fifth insulating layer completely from said substrate, etching anisotropically and patterning said third polysilicon layer, and forming bottom capacitor electrodes having a fin shape, forming a capacitor dielectric layer on the surface of said bottom capacitor electrodes, depositing a fifth polysilicon layer on said substrate and forming the top capacitor electrode, and thereby completing said dynamic random access memory cells having said storage capacitors.

2. The method of claim 1, wherein the thickness of said first polysilicon layer is between about 1000 to 2000 Angstroms.

3. The method of claim 1, wherein said first insulating layer is composed of silicon oxide having a thickness of between about 1500 to 3000 Angstroms.

4. The method of claim 1, wherein said second insulating layer is composed of silicon oxide having a thickness of between about 1500 to 2000 Angstroms.

5. The method of claim 1, wherein said second polysilicon layer is deposited by chemical vapor deposition in situ doped N-type and having a thickness between about 500 to 1000 Angstroms.

6. The method of claim 1, wherein said metal silicide layer is a chemical vapor deposited tungsten silicide having a thickness between about 500 to 1500 Angstroms.

7. The method of claim 1, wherein said third insulating layer is a chemical vapor deposited silicon oxide having a thickness between about 500 to 1000 Angstroms.

8. The method of claim 1, wherein said third polysilicon layer is formed by chemical vapor deposition in situ doped N-type and having a thickness of between about 500 to 2000 Angstroms.

9. The method of claim 1, wherein said fourth insulating layer is a chemical vapor deposited silicon oxide having a thickness of between about 1000 to 3000 Angstroms.

10. The method of claim 1, wherein said fourth polysilicon layer is deposited by chemical vapor deposition in situ doped N-type and having a thickness of between about 2000 to 5000 Angstroms.

11. The method of claim 1, wherein said isotropic etch of said fifth insulating layer is performed in an buffered oxide etch, BOE, of ammonium fluoride ($NH_4F$) and hydrofluoric acid (HF) having a ratio of 10 to 1 by volume.

12. The method of claim 1, wherein said third polysilicon layer provides an etch stop layer, protecting the device structures thereunder from said BOE etch of claim 11.

13. The method of claim 1, wherein said capacitor dielectric is composed of silicon oxide/silicon oxide/silicon oxide (ONO) having a total thickness of between about 50 to 60 Angstroms.

14. The method of claim 1, wherein said fifth polysilicon layer is doped with N-type impurities and having a thickness of between about 1000 to 2000 Angstroms.

15. A method for fabricating a stacked storage capacitor on a semiconductor substrate having device areas formed thereon comprising the steps of:

providing a semiconductor substrate having field oxide areas while leaving device areas with semiconductor devices and device contacts therein;

forming a substrate insulating layer on said substrate and forming thereon said stacked storage capacitor by, etching contact openings in said substrate insulating layer exposing said device contact, conformally depositing a first bottom electrode polysilicon layer on said substrate without filling said contact openings to said source/drain regions, and thereby making electrical contact by out diffusing dopants from said first bottom electrode polysilicon layer to said device contacts, depositing a sacrificial oxide layer on said first bottom electrode polysilicon layer, masking and etching contact openings in said sacrificial oxide layer exposing said first bottom electrode polysilicon layer only and directly over said device areas, depositing a second bottom electrode polysilicon layer on said sacrificial oxide layer and making electrical contact to said first bottom electrode polysilicon layer through said contact openings in said sacrificial oxide layer, and wherein said second bottom electrode polysilicon layer fills said contact openings in said sacrificial oxide layer, patterning and etching said second bottom electrode polysilicon layer over said sacrificial oxide layer and leaving portions over said device areas, etching isotropically and removing said sacrificial oxide layer completely from said substrate, patterning by anisotropic etching said first bottom electrode polysilicon layer, leaving portion under and aligned to said patterned second bottom electrode polysilicon layer, thereby forming fin shaped bottom capacitor electrodes, forming a capacitor dielectric layer on a surface of said bottom capacitor electrodes, depositing a top electrode polysilicon layer and forming a top capacitor electrode, and thereby completing said stacked storage capacitors making electrical contact to said semiconductor device contacts.

16. The method of claim 15, wherein said first bottom polysilicon layer is deposited by low pressure chemical vapor deposition in situ doped N-type having a thickness of between about 500 to 2000 Angstroms.

17. The method of claim 15, wherein said sacrificial oxide layer is composed of silicon oxide having a thickness of between about 1000 to 3000 Angstroms.

18. The method of claim 15, wherein said second bottom electrode polysilicon layer is deposited by low pressure chemical vapor deposition in situ doped N-type and having a thickness between about 2000 to 5000 Angstroms.

19. The method of claim 15, wherein said isotropic etch of said sacrificial oxide is performed in a buffered oxide etch (BOE) of ammonium fluoride ($NH_4F$) and hydrofluoric acid (HF) having a ratio of 10 to 1 by volume.

20. The method of claim 15, wherein said first bottom polysilicon layer provides an etch stop layer, protecting the device structures thereunder from said isotropic etch.

21. The method of claim 15, wherein said capacitor dielectric is composed of silicon oxide/silicon oxide/silicon oxide (ONO) having a total thickness of between about 50 to 60 Angstroms.

22. The method of claim 15, wherein said top electrode polysilicon layer is doped with N-type impurities and having a thickness of between about 1000 to 2000 Angstroms.

23. The method of claim 15, wherein said semiconductor devices are field effect transistor and said device contacts are source/drain areas.

* * * * *